United States Patent
Zhang et al.

(10) Patent No.: US 11,893,271 B2
(45) Date of Patent: Feb. 6, 2024

(54) COMPUTING-IN-MEMORY CIRCUIT

(71) Applicant: INSTITUTE OF MICROELECTRONICS OF THE CHINESE ACADEMY OF SCIENCES, Beijing (CN)

(72) Inventors: Feng Zhang, Beijing (CN); Renjun Song, Beijing (CN)

(73) Assignee: INSTITUTE OF MICROELECTRONICS OF THE CHINESE ACADEMY OF SCIENCES, Beijing (CN)

( * ) Notice: Subject to any disclaimer, the term of this patent is extended or adjusted under 35 U.S.C. 154(b) by 55 days.

(21) Appl. No.: 17/904,619

(22) PCT Filed: Jul. 23, 2020

(86) PCT No.: PCT/CN2020/103791
§ 371 (c)(1),
(2) Date: Aug. 19, 2022

(87) PCT Pub. No.: WO2021/248643
PCT Pub. Date: Dec. 16, 2021

(65) Prior Publication Data
US 2023/0104404 A1    Apr. 6, 2023

(30) Foreign Application Priority Data
Jun. 8, 2020   (CN) .......................... 202010512166.7

(51) Int. Cl.
*G06N 3/063* (2023.01)
*G06F 3/06* (2006.01)

(52) U.S. Cl.
CPC ............ *G06F 3/0655* (2013.01); *G06F 3/061* (2013.01); *G06F 3/0673* (2013.01); *G06N 3/063* (2013.01)

(58) Field of Classification Search
None
See application file for complete search history.

(56) References Cited

U.S. PATENT DOCUMENTS

| 10,296,829 | B2 * | 5/2019 | Mostafa | G06N 3/045 |
| 10,777,259 | B1 * | 9/2020 | Wang | G06N 3/045 |
| 11,776,608 | B2 * | 10/2023 | Li | G11C 11/54 |
| | | | | 706/41 |
| 2018/0137407 | A1 * | 5/2018 | Du | G06N 3/063 |
| 2019/0370309 | A1 * | 12/2019 | Kim | G06N 3/08 |

(Continued)

*Primary Examiner* — Elias Mamo
(74) *Attorney, Agent, or Firm* — Syncoda LLC; Feng Ma

(57) ABSTRACT

A computing-in-memory circuit includes a Resistive Random Access Memory (RRAM) array and a peripheral circuit. The RRAM array comprises a plurality of memory cells arranged in an array pattern, and each memory cell is configured to store a data of L bits, L being an integer not less than 2. The peripheral circuit is configured to, in a storage mode, write more than one convolution kernels into the RRAM array, and in a computation mode, input elements that need to be convolved in a pixel matrix into the RRAM array and read a current of each column of memory cells, wherein each column of memory cells stores one convolution kernel correspondingly, and one element of the convolution kernel is stored in one memory cell correspondingly, and one element of the pixel matrix is correspondingly input into a word line that a row of memory cells connect.

10 Claims, 5 Drawing Sheets

(56) References Cited

U.S. PATENT DOCUMENTS

2022/0207356 A1* 6/2022 Kim .................. G06F 17/16
2023/0206049 A1* 6/2023 Sun .................. G06N 3/063
　　　　　　　　　　　　　　　　　　　706/15
2023/0237770 A1* 7/2023 Sombatsiri ............ G06N 3/045
　　　　　　　　　　　　　　　　　　　382/190

* cited by examiner

COMPUTING-IN-MEMORY CIRCUIT

CROSS-REFERENCE TO RELATED APPLICATIONS

This disclosure is a national stage of International Application No. PCT/CN2020/103791 filed on Jul. 23, 2020, which claims priority to Chinese Patent Application No. 202010512166.7 filed on Jun. 8, 2020. The disclosures of the above-referenced applications are hereby incorporated by reference in their entirety.

TECHNICAL FIELD

The present disclosure belongs to the technical field of integrated circuits, and in particular, relates to a computing-in-memory circuit.

BACKGROUND OF THE INVENTION

Artificial neural networks have greatly promoted developments of Internet of Things (IoT) applications and edge computing. However, high requirements of the artificial neural networks for computing and memory resources contradict limited resources of edge devices so that various challenges have been brought to the edge devices due to this contradiction. Massive data movement between memories and computing units consumes power and time, which raises higher requirements on hardware based on von Neumann architecture.

In-memory computing methods have been proposed to overcome the bottleneck of the von Neumann architecture because of their excellent capabilities of in-memory parallel computing, and Resistive Random Access Memory (RRAM) devices are considered as a suitable candidate for in-memory computing architectures. A RRAM array is generally presented in a crossbar array pattern, where matrix weights are expressed as a conductance. The crossbar arrays enable vector-matrix multiplication in a very natural manner, which is of great significance for various AI (Artificial Intelligence)-based applications: not only can the weights be stored to reduce data movement permanently, but also the time complexity of matrix-vector multiplication can be effectively reduced.

At present, many pioneering works have already demonstrated the great application potential of the RRAM array-based in-memory computing. However, in the existing RRAM array-based neural network hardware schemes, it is mainly binary neural network to be deployed on a RRAM array, resulting in low recognition accuracy of the neural network. At the same time, the existing operation enabled by the RRAM array is generally only limited to a fully connected layer in the neural network, so that advantages of the RRAM array are unable to be fully utilized.

SUMMARY OF THE INVENTION

In view of the problems existing in the art, the present disclosure provides a computing-in-memory circuit for solving the problems in the art that a RRAM array-based neural network is low in recognition accuracy and is limited to operation of a fully connected layer.

The present disclosure provides a computing-in-memory circuit, which includes a Resistive Random Access Memory (RRAM) array and a peripheral circuit; the RRAM array includes a plurality of memory cells arranged in an array pattern, and each memory cell is configured to store a data of L bits, L being an integer not less than 2; the peripheral circuit is configured to, in a storage mode, write more than one convolution kernels into the RRAM array, and in a computation mode, input elements that need to be convolved in a pixel matrix into the RRAM array and read a current of each column of memory cells, wherein each column of memory cells stores one convolution kernel in a corresponding manner, and one element of the convolution kernel is stored in one memory cell correspondingly, and one element of the pixel matrix is correspondingly input into a word line that a row of memory cells connect.

In some embodiments, each memory cell may be configured to store a data of two bits, and the RRAM array includes M word lines, N first bit lines, N second bit lines, N first source lines, N second source lines, and memory cells of M rows and N columns, wherein M and N are positive integers; said memory cell includes a first unit and a second unit, the first unit includes a first switch and a first memristor, and the second unit includes a second switch and a second memristor; a control end of the first switch serves as a first end of the memory cell, one end of the first switch serves as a second end of the memory cell, and another end of the first switch is connected to one end of the first memristor, the other end of the first memristor serves as a third end of the memory cell, a control end of the second switch serves as a fourth end of the memory cell, one end of the second switch serves as a fifth end of the memory cell, another end of the second switch is connected to one end of the second memristor, and the other end of the second memristor serves as a sixth end of the memory cell; the first end and the fourth end of each of the memory cells located in a same row are connected to a same word line, the second end of each of the memory cells located in a same column is connected to a same first source line, the third end of each of the memory cells located in the same column is connected to a same first bit line, the fifth end of each of the memory cells located in the same column is connected to a same second source line, and the sixth end of each of the memory cells located in the same column is connected to a same second bit line.

In some embodiments, the peripheral circuit may include a word line module, a bit line module and a source line module; the word line module is configured to supply respective word line voltages to the M word lines in the storage mode, and input elements corresponding elements in the pixel matrix into the M word lines in the computation mode; the bit line module is configured to supply respective bit line voltages to the N first bit lines and the N second bit lines in the storage mode, and read the current of each column of memory cells in the computation mode; the source line module is configured to supply respective source line voltages to the N first source lines and the N second source lines in the storage mode and the computation mode, respectively.

In some embodiments, each element in the pixel matrix may be serial data of two bits.

In some embodiments, the bit line module may include a first gating circuit, a second gating circuit, a first voltage supply circuit, a second voltage supply circuit, and a readout circuit; the first gating circuit is configured to, in the storage mode, connect a first bit line that a selected memory cell connects with an output terminal of the first voltage supply circuit, and is configured to, in the computation mode, connect the first bit line that the selected memory cell connects with a first input terminal of the readout circuit; the second gating circuit is configured to, in the storage mode, connect a second bit line that the selected memory cell connects with an output terminal of the second voltage supply circuit, and is configured to, in the computation mode, connect the second bit line that the selected memory cell connects with a second input terminal of the readout circuit; the first voltage supply circuit is configured to, in the storage mode, supply a set voltage to the first bit line that the selected memory cell connects, and the second voltage supply circuit is configured to, in the storage mode, supply the set voltage to the second bit line that the selected memory cell connects; and the readout circuit is configured to, in the computation mode, read out the current of each memory cell located in the same column and accumulate the current of each memory cell located in the same column together.

In some embodiments, the first gating circuit may include a storage control switch, a computation control switch, and N column gating switches; one end of the storage control switch is connected to the output terminal of the first voltage supply circuit, and another end of the storage control switch is connected to one end of the computation control switch and one end of each of the N column gating switches, and a control end of the storage control switch receives a first control signal; another end of the computation control switch is connected to the first input terminal of the readout circuit, and a control end of the computation control switch receives a second control signal; and another end of each column gating switch is correspondingly connected to a first bit line, a control end of each column gating switch correspondingly receives a column gating signal.

In some embodiments, the first voltage supply circuit may include a level shifter, an inverter and a CMOS transmission gate; one input end of the level shifter is connected to an input end of the inverter, and an output end of the inverter is connected to the other input end of the level shifter, one output end of the level shifter is connected to one control end of the CMOS transmission gate, the other output end of the level shifter is connected to the other control end of the CMOS transmission gate, an input end of the CMOS transmission gate is configured to receive an operating voltage, and an output end of the CMOS transmission gate serves as an output terminal of the first voltage supply circuit.

In some embodiments, the readout circuit may include a first amplifier circuit, a second amplifier circuit, a current node, an Analog-Digital (AD) converter, and an accumulator; the first amplifier circuit is configured to amplify a current on a first bit line that a selected memory cell connects, to obtain a first amplified current; the second amplifier circuit is configured to amplify a current on a second bit line that the selected memory cell connects, to obtain a second amplified current, wherein an amplification factor of the second amplifier circuit is different from an amplification factor of the first amplifier circuit; the current node is configured to receive the first amplified current and the second amplified current, to obtain a current of the selected memory cell; the AD converter is configured to convert the current of the selected memory cell into a corresponding digital signal; and the accumulator is configured to accumulate the digital signal corresponding to the current of each memory cell located in the same column together.

In some embodiments, the first amplifier circuit may include a first PMOS transistor, a second PMOS transistor, a third PMOS transistor, a fourth PMOS transistor, a fifth PMOS transistor, a sixth PMOS transistor, a toggle switch, and an energy storage unit; a source of the first PMOS transistor serves as a first input terminal of the first amplifier circuit, a gate of the first PMOS transistor receives a bias voltage, and a drain of the first PMOS transistor is connected to a gate of the second PMOS transistor, a source of the second PMOS transistor and a source of the third PMOS transistor; a drain of the second PMOS transistor is connected to a drain of the third PMOS transistor; a source of the third PMOS transistor is connected to a drain of the fourth PMOS transistor; a gate of the fourth PMOS transistor is connected to one end of the toggle switch and a gate of the sixth PMOS transistor, and a source of the fourth PMOS transistor is connected to a source of the fifth PMOS transistor and a source of the sixth PMOS transistor; a gate of the fifth PMOS transistor is connected to the other end of the toggle switch and the energy storage unit, and a drain of the fifth PMOS transistor and a drain of the sixth PMOS transistor are connected to the current node; and a control end of the toggle switch receives a switching control signal.

In some embodiments, the energy storage unit may be an NMOS transistor; a gate of the NMOS transistor is connected to the other end of the toggle switch and a gate of the fifth PMOS transistor, and a source of the NMOS transistor is connected to a drain of the NMOS transistor and a substrate of the NMOS of transistor.

A computing-in-memory circuit according to one or more embodiments of the present disclosure includes a Resistive Random Access Memory (RRAM) array and a peripheral circuit. The RRAM array includes a plurality of memory cells arranged in an array pattern, and each memory cell is configured to store a data of L bits, L being an integer not less than 2; the peripheral circuit is configured to, in a storage mode, write more than one convolution kernels into the RRAM array, and in a computation mode, input corresponding elements in a pixel matrix into the RRAM array and read a current of each column of memory cells, wherein each column of memory cells correspondingly stores one convolution kernel, one element of the convolution kernel is correspondingly stored in one memory cell, and one element of the pixel matrix is correspondingly input into a word line to which a row of memory cells are connected.

As one memory cell stores one element of a convolution kernel correspondingly and one element of the pixel matrix correspondingly serves as an input for a word line that a row of memory cells connects, a current of each memory cell represents a product of one element of the pixel matrix and one element of the convolution kernel, and a current of a column of memory cells represents a convolution result of corresponding elements in the pixel matrix and the one convolution kernel. Therefore, the present disclosure enables convolution operation in a neural network by using said RRAM array. Moreover, as each memory cell stores data of more than two bits, i.e., more bits are used to represent an element of the convolution kernel, element representation of the convolution kernel is more accurate so that recognition accuracy of the neural network can be improved.

BRIEF DESCRIPTION OF THE DRAWINGS

Various other advantages and benefits will become apparent to those of ordinary skill in the art upon reading the following detailed description of the preferred embodiments. The drawings are for the purpose of illustrating preferred embodiments only and are not to be considered limiting of the present disclosure. Also, the same reference numerals are applied to denote identical components throughout the drawings. In the drawings.

DETAILED DESCRIPTION OF THE INVENTION

Figure 1:
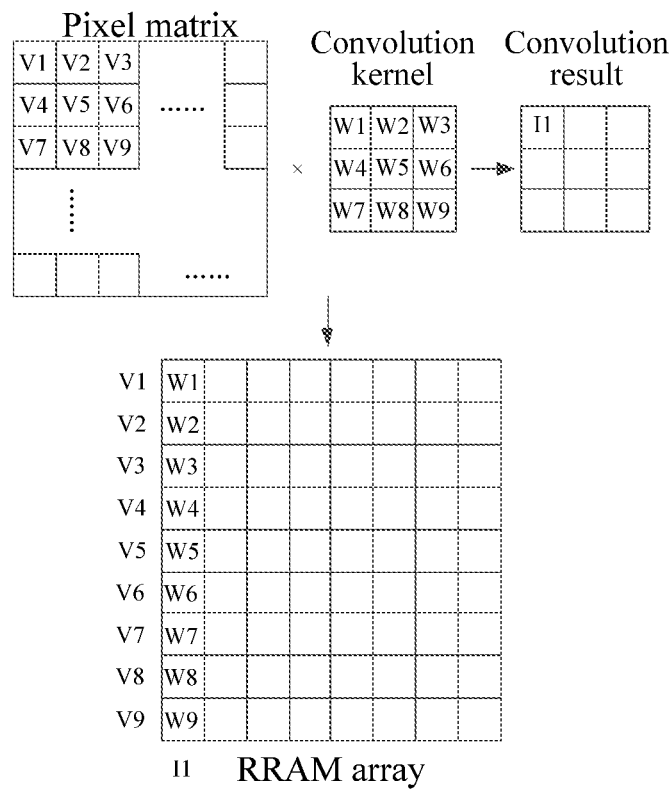
FIG. 1 is a schematic diagram of a mapping relationship between a convolution operation and a RRAM array in a computing-in-memory circuit according to some embodiments of the present disclosure.

Exemplary embodiments of the present disclosure will be described in more detail below with reference to the accompanying drawings. While exemplary embodiments of the present disclosure are illustrated in the drawings, it should be understood that the present disclosure may be embodied in various forms and should not be limited by the embodiments set forth herein. Rather, these embodiments are provided so that the present disclosure will be more thoroughly understood and the scope of the present disclosure will be fully conveyed to those skilled in the art.

The technical solutions of the present disclosure will be further described in detail below through the accompanying drawings and specific embodiments.

The present disclosure provides a computing-in-memory circuit, which includes a Resistive Random Access Memory (RRAM) array and a peripheral circuit.

The RRAM array includes a plurality of memory cells arranged in an array pattern, and each memory cell is configured to store a data of L bits, L is an integer not less than 2, that is, L is equal to or more than 2.

The peripheral circuit is configured to, in a storage mode, write more than one convolution kernels into the RRAM array, and in a computation mode, input elements that need to be convolved in a pixel matrix into the RRAM array and read a current of each column of memory cells. In this case, each column of memory cells stores one convolution kernel correspondingly, and one element of said convolution kernel is stored in one memory cell correspondingly. That is, one element of said convolution kernel is expressed in the form of L bits, and one element of the pixel matrix is correspondingly input into a word line that a row of memory cells connects.

As one memory cell stores one element of a convolution kernel correspondingly and one element of the pixel matrix correspondingly serves as an input for a word line that a row of memory cells connects, the current of each memory cell represents a product of one element of the pixel matrix and one element of the convolution kernel, and a current of a column of memory cells represents a convolution result of corresponding elements in the pixel matrix and the one convolution kernel. Therefore, the present disclosure enables convolution operation in a neural network by using said RRAM array. Moreover, as each memory cell stores data of more than two bits, i.e., more bits are used to represent an element of the convolution kernel, element representation of the convolution kernel is more accurate so that recognition accuracy of the neural network can be improved.

Taking a 3×3 convolution kernel as an example, FIG. 1 is a schematic diagram of a mapping relationship between convolution operation and a RRAM array of the present disclosure. As the convolution kernel is 3×3 in size, i.e., the convolution kernel includes 9 elements, 9 pixels in the pixel matrix are subjected to the convolution operation each time. Also, since each column of memory cells stores one convolution kernel correspondingly and one element of the convolution kernel is correspondingly stored in one memory cell, the RRAM array includes 9 rows of memory cells.

An example is taken by using the first column of memory cells to store the convolution kernel shown in the figure. In a storage mode, the peripheral circuit writes an element W1 of the convolution kernel into a first memory cell of the first row, an element W2 of the convolution kernel into a first memory cell of the second row, an element W3 of the convolution kernel into a first memory cell of the third row, an element W4 of the convolution kernel into a first memory cell of the fourth row, an element W5 of the convolution kernel into a first memory cell in the fifth row, an element W6 of the convolution kernel into a first memory cell in the sixth row, an element W7 of the convolution kernel into a first memory cell in the seventh row, an element W8 of the convolution kernel into a first memory cell of the eighth row, and an element W9 of the convolution kernel into a first memory cell of the ninth row. Upon elements of the convolution kernel are written into the RRAM array, memory cells storing different elements have different resistance values.

In a computation mode, the peripheral circuit inputs an element V1 of the pixel matrix into a word line connected with the first row of memory cells, an element V2 of the pixel matrix into a word line connected with the second row of memory cells, an element V3 of the pixel matrix into a word line connected with the third row of memory cells, an element V4 of the pixel matrix into a word line connected with the fourth row of memory cells, an element V5 of the pixel matrix into a word line connected with the fifth row of memory cells, an element V6 of the matrix into a word line connected with the sixth row of memory cells, an element V7 of the pixel matrix into a word line connected with the seventh row of memory cells, an element V8 of the pixel matrix into a word line connected with the eighth row of memory cells, and an element V9 of the pixel matrix into a word line connected with the ninth row of memory cells. By inputting respective elements in the pixel matrix into the RRAM array, the respective elements in the pixel matrix each interact with the memory cells storing different resistance values to generate the current, and the current of each memory cell corresponds to multiplication operation of the convolution operation, the current of each column of memory cells corresponds to summation operation of the convolution operation. For example, the current Il of the first column of memory cells is a result of convolution between the convolution kernel and the corresponding 9 pixels in the pixel matrix shown in FIG. 1. In some embodiments, the RRAM array includes 8 columns of memory cells, and each column of memory cells stores one convolution kernel correspondingly, so the RRAM array can deploy 8 convolution kernels at a time.

Figure 2:
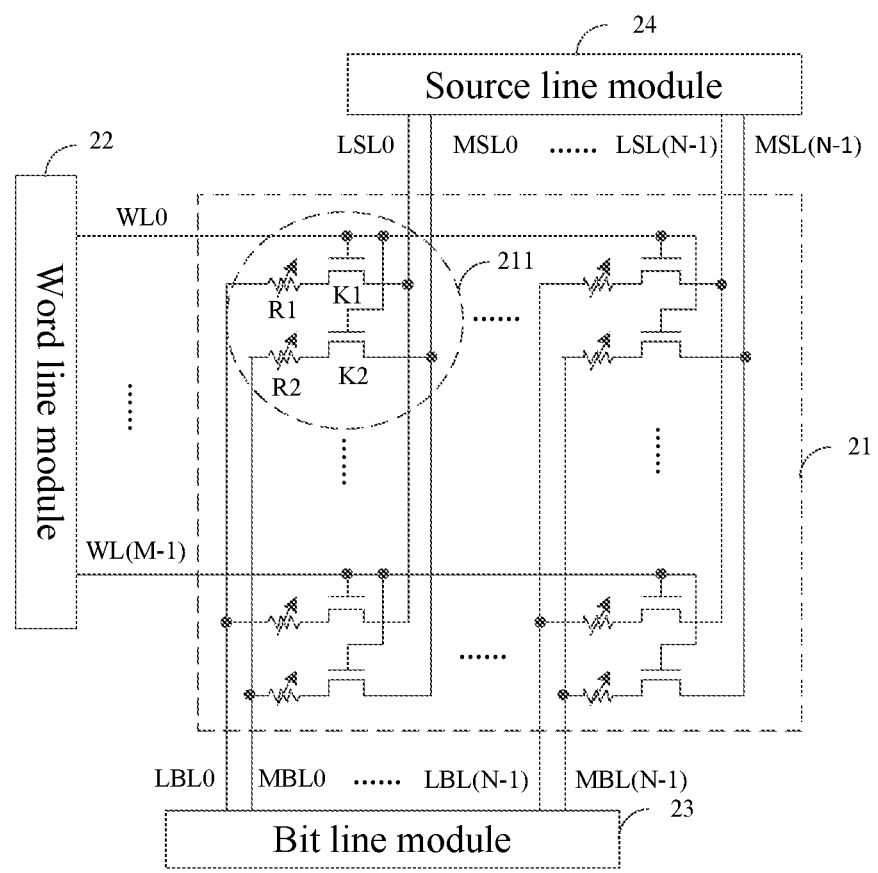
FIG. 2 is a schematic diagram of a circuit structure of a computing-in-memory circuit according to some embodiments of the present disclosure.

In some embodiments of the present disclosure, it is possible for each memory cell to store a data of two bits. FIG. 2 is a schematic diagram of a circuit structure of a computing-in-memory circuit according to some embodiments of the present disclosure. In FIG. 2, the computing-in-memory circuit includes a RRAM array and a peripheral circuit, wherein the RRAM array includes M word lines WL (0~M−1), N first bit lines LBL (0~N−1), N second bit lines MBL (0~N−1), N first source lines LSL (0~N−1), N second source lines MSL (0~N−1), and memory cells 21 of M rows and N columns, M and N being positive integers. In some embodiments, exemplary illustration is proceeded by picking 9 as the value of M and 8 as the value of N, that is, the RRAM array includes 9 word lines (word lines WL0~WL8), 8 first bit lines (LBL0~LBL7), 8 second bit lines (MBL0~MBL7), 8 first source lines (LSL0~LSL7), 8 second source lines (MSL0~MSL7), and memory cells 21 of 9 rows and 8 columns.

Each memory cell adopts a 2T2R (two transistor and two resistance) structure, including a first unit and a second unit. Taking the memory cell 211 as an example, the first unit includes a first switch K1 and a first memristor R1, and the second unit includes a second switch K2 and a second memristor R2. A control end of the first switch K1 serves as a first end of a memory cell, one end of the first switch K1 serves as a second end of the memory cell, and another end of the first switch K1 is connected to one end of the first memristor R1, and the other end of the first memristor R1 serves as a third end of the memory cell. A control end of the second switch K2 serves as a fourth end of the memory cell, one end of the second switch K2 serves as a fifth end of the memory cell, another end of the second switch K2 is connected to one end of the second memristor R2, and the other end of the second memristor R2 serves as a sixth end of the memory cell. The first switch K1 and the second switch K2 may be transistors, such as NMOS transistors.

The first end and the fourth end of each of the memory cells located in the same row are connected to the same word line, that is, the first and fourth ends of the memory cells located in the first row are connected to a word line WL0, . . . , and the first and fourth ends of the memory cells located in the ninth row are connected to a word line WL8. The second end of each of the memory cells located in the same column is connected to the same first source line, that is, the second ends of the memory cells located in the first column are connected to a first source line LSL0, . . . , and the second ends of the memory cells located in the eighth column are connected to a first source line LSL7. The third end of each of the memory cells located in the same column is connected to the same first bit line, that is, the third ends of the memory cells located in the first column are connected to a first bit line LBL0, . . . , and the third ends of the memory cells located in the eighth column are connected to a first bit line LBL7. The fifth end of each of the memory cells located in the same column is connected to the same second source line, that is, the fifth ends of the memory cells located in the first column are connected to a second source line MSL0, . . . , and the fifth ends of the memory cells located in the eighth column are connected to a second source line MSL7. The sixth end of each of the memory cells located in the same column is connected to the same second bit line, that is, the sixth ends of the memory cells located in the first column are connected to a second bit line MBL0, . . . , and the sixth ends of the memory cells located in the eighth column are connected to a second bit line MBL7.

The first unit is a low-order data unit and may represent binary data 0 or 1; and the second unit is a high-order data unit and may also represent binary data 0 or 1. Thus, each memory cell can represent binary data 00, 01, 10 or 11. The first source line is a source line to which the low-order data unit is connected, and the second source line is a source line to which the high-order data unit is connected. The first bit line is a bit line to which the low-order data units is connected, and the second bit line is a bit line to which the high-order data unit is connected.

The peripheral circuit includes a word line module 22, a bit line module 23, and a source line module 24.

The word line module 22 is configured to supply respective word line voltages to the M word lines in the storage mode, and input corresponding elements in the pixel matrix into the M word lines in the computation mode. In the storage mode, the word line module 22 supplies a voltage of 1V to 2V to word lines that selected memory cells connect, and supplies a voltage of 0V to word lines that unselected memory cells connect; and in the computation mode, the word line module 22 inputs the corresponding elements in the pixel matrix into the word lines that the selected memory cells connect, and supplies a voltage of 0V to the word lines that the unselected memory cells connect.

In the present embodiment, each element in the pixel matrix is two-bit serial data. Therefore, in the computation mode, data received by a word line that a selected memory cell connects is a binary data 00, 01, 10 or 11. The following table shows the current of a corresponding memory cell under different circumstances in which elements in a pixel interacts with elements in the convolution kernel. As an element in the pixel and an element in the convolution kernel each are two-bit data, data of the memory cell resulted by multiplying the two needs to be represented in the form of four bits.

| Current in memory cell | | Elements in convolution kernel | | | |
|---|---|---|---|---|---|
| | | 00 | 01 | 10 | 11 |
| Elements in pixel | 00 | 0000 | 0000 | 0000 | 0000 |
| | 01 | 0000 | 0001 | 0010 | 0011 |
| | 10 | 0000 | 0010 | 0100 | 0110 |
| | 11 | 0000 | 0011 | 0110 | 1001 |

The bit line module 23 is configured to supply respective bit line voltages to the N first bit lines and the N second bit lines in the storage mode, and read the current of each column of memory cells in the computation mode.

Figure 3:
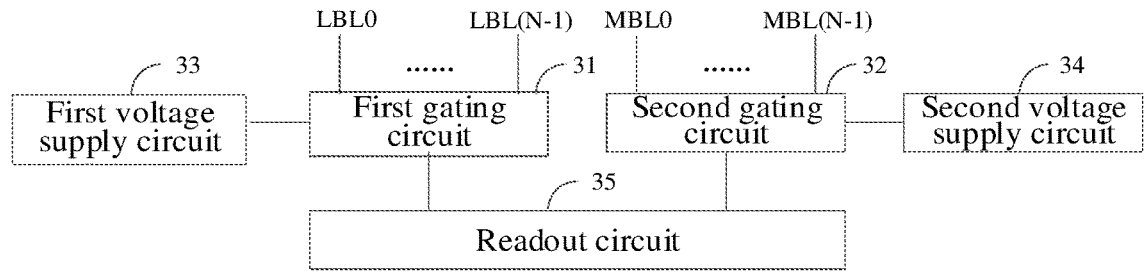
FIG. 3 is a schematic diagram of a circuit structure of a bit line module in a computing-in-memory circuit according to some embodiments of the present disclosure.

FIG. 3 is a schematic diagram of a circuit structure of a bit line module of a computing-in-memory circuit according to some embodiments of the present disclosure. In FIG. 3, the bit line module 23 includes a first gating circuit 31, a second gating circuit 32, a first voltage supply circuit 33, a second voltage supply circuit 34, and a readout circuit 35.

The first gating circuit 31 is configured to, in the storage mode, connect a first bit line that a selected memory cell connects with an output terminal of the first voltage supply circuit 33, and in the computation mode, connect the first bit line that the selected memory cell connects with a first input terminal of the readout circuit 35. For example, the selected memory cell is a certain memory cell of the first column. In the storage mode, the first gating circuit 31 connects a first bit line LBL0 with the output terminal of the first voltage supply circuit 33 so that the first bit line LBL0 receives a set voltage provided by the first voltage supply circuit 33; and in the computation mode, the first gating circuit 31 connects the first bit line LBL0 with the first input terminal of the readout circuit 35 so that the readout circuit 35 reads out the current of a low-order data unit.

The second gating circuit 32 is configured to, in the storage mode, connect a second bit line that the selected memory cell connects with an output terminal of the second voltage supply circuit 34, and in the computation mode, connect the second bit line that the selected memory cell connects with a second input terminal of the readout circuit 35. For example, the selected memory cell is a certain memory cell of the first column. In the storage mode, the second gating circuit 32 connects a second bit line MBL0 with the output terminal of the second voltage supply circuit 34 so that the second bit line MBL0 receives a set voltage provided by the second voltage supply circuit 34; and in the computation mode, the second gating circuit 32 connects the second bit line MBL0 with the second input terminal of the readout circuit 35 so that the readout circuit 35 reads out the current of a high-order data unit.

The first voltage supply circuit 33 is configured to, in the storage mode, supply the set voltage to the first bit line that the selected memory cell connects. For example, the selected memory cell is a certain memory cell of the first column. The first voltage supply circuit 33 supplies a set voltage to a first bit line LBL0 in the storage mode. The second voltage supply circuit 34 is configured to supply the set voltage to a second bit line that the selected memory cell connects in the storage mode. For example, the selected memory cell is a certain memory cell of the first column. The second voltage supply circuit 24 supplies a set voltage to a second bit line MBL0 in the storage mode.

The readout circuit 35 is configured to, in the computation mode, read out the current of each memory cell located in the same column, i.e., reading each memory cell located in the same column in turn to obtain the current of each memory cell in the same column, and is configured to perform accumulation for the current of each memory cell located in the same column.

Figure 4:
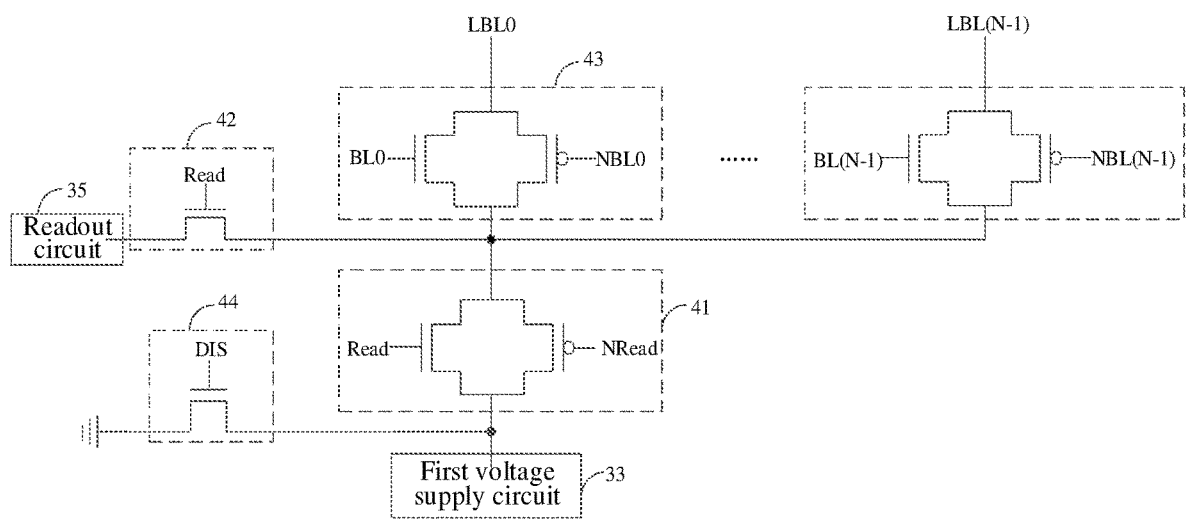
FIG. 4 is a circuit diagram of a first gating circuit in a computing-in-memory circuit according to some embodiments of the present disclosure.

FIG. 4 is a circuit diagram of a first gating circuit of a computing-in-memory circuit according to some embodiments of the present disclosure. In FIG. 4, the first gating circuit 31 may include a storage control switch 41, a computation control switch 42, and N column gating switches 43.

One end of the storage control switch 41 is connected to the output terminal of the first voltage supply circuit 33, and another end of the storage control switch 41 is connected to one end of the computation control switch 42 as well as one end of each of the N column gating switches 43, and a control end of the storage control switch 41 receives a first control signal. The first control signal is configured to control the storage control switch 41 to turn on in the storage mode and control the storage control switch 41 to turn off in the computation mode. In some embodiments, the storage control switch 41 is a CMOS transmission gate, and the first control signal is a read enable signal Read. When the read enable signal Read is valid, the read enable signal Read controls the storage control switch 41 to turn off; when the read enable signal Read is invalid, the read enable signal Read controls the storage control switch 41 to turn on.

Another end of the computation control switch 42 is connected to the first input terminal of the readout circuit 35, and a control end of the computation control switch 42 receives a second control signal. The second control signal is configured to control the computation control switch 42 to turn off in the storage mode and control the computation control switch 42 to turn on in the computation mode. In some embodiments, the computing control switch 42 is an NMOS transistor, and the second control signal is a read enabling signal Read. When the read enabling signal Read is valid, the read enabling signal Read controls the computation control switch 42 to turn on; when the read enabling signal Read is invalid, the read enabling signal Read controls the computation control switch 42 to turn off.

Another end of each column gating switch 43 is correspondingly connected to one first bit line, that is, another end of a first column gating switch 43 is connected to a first bit line LBL0, . . . , and another end of an eighth column gating switch 43 is connected to a first bit line LBL7. A control end of each column gating switch 43 correspondingly receives one column gating signal, that is, a control end of the first column gating switch 43 receives a column gating signal BL0, . . . , and a control end of the eighth column gating switch 43 receives a column gating signal BL7. The column gating signals are generated by decoding column address signals using a column decoder. When a column gating signal is valid, the column gating signal controls a corresponding column gating switch to turn on; when the column gating signal is invalid, the column gating signal controls the corresponding column gating switch to turn off. In some embodiments, the column gating switches 43 are CMOS transmission gates.

In some embodiments, the first gating circuit 31 may further include an enabling switch 44. One end of the enabling switch 44 is connected to one end of the storage control switch 41, another end of the enabling switch 44 is grounded, and a control end of the enabling switch 44 is configured to receive an enabling signal DIS. The enabling signal DIS controls the enabling switch 44 to turn on in the case that no operation is required for the computing-in-memory circuit, and controls the enabling switch 44 to turn off otherwise. In some embodiments, the enabling switch 44 is an NMOS transistor.

A circuit structure of the second gating circuit 32 is the same as that of the first gating circuit 31, which will not be described any further here.

Figure 5:
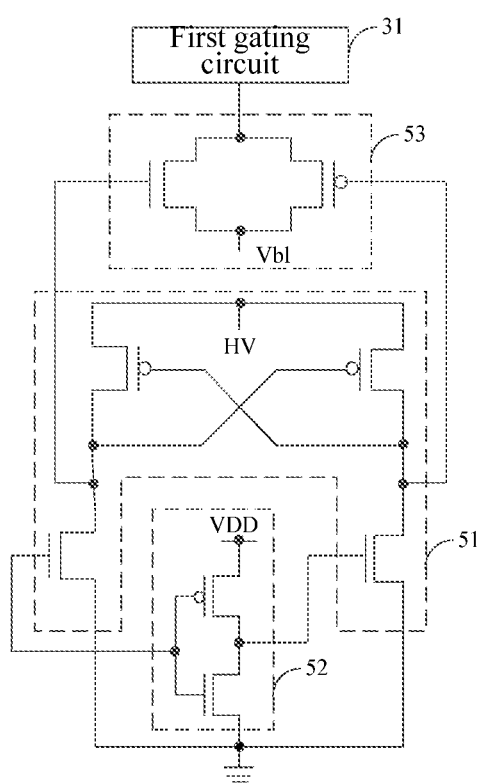
FIG. 5 is a circuit diagram of a first voltage supply circuit in a computing-in-memory circuit according to some embodiments of the present disclosure.

FIG. 5 is a circuit diagram of a first voltage supply circuit of a computing-in-memory circuit according to some embodiments of the present disclosure. In FIG. 5, the first voltage supply circuit 33 may include a level shifter 51, an inverter 52 and a CMOS transmission gate 53.

One input end of the level shifter 51 is connected to an input end of the inverter 52, and an output end of the inverter 52 is connected to the other input end of the level shifter 51. One output end of the level shifter 51 is connected to one control end of the CMOS transmission gate 53, the other output end of the level shifter 51 is connected to the other control end of the CMOS transmission gate 53. An input end of the CMOS transmission gate 53 is configured to receive an operating voltage Vbl, and an output end of the CMOS transmission gate 53 serves as an output terminal of the first voltage supply circuit 33. The level shifter 51 is configured to perform voltage level shift, in which a high level of a control signal of the CMOS transmission gate 53 is shifted from a power supply voltage VDD to a high voltage HV. In the storage mode, the first voltage supply circuit 33 is configured to supply the set voltage, wherein a voltage value of the operating voltage Vbl is 2V to 3V. In the case that the RRAM array is subjected to initialization, the first voltage supply circuit 33 is configured to supply an initialization voltage, wherein a voltage value of the operating voltage Vbl is 3V to 4V; and in the case that the RRAM array is reset, the first voltage supply circuit 33 is configured to supply a reset voltage, wherein the voltage value of the operating voltage Vbl is 2V to 3V.

A circuit structure of the second voltage supply circuit 34 is the same as that of the first voltage supply circuit 33, which will not be described any further here.

Figure 6:
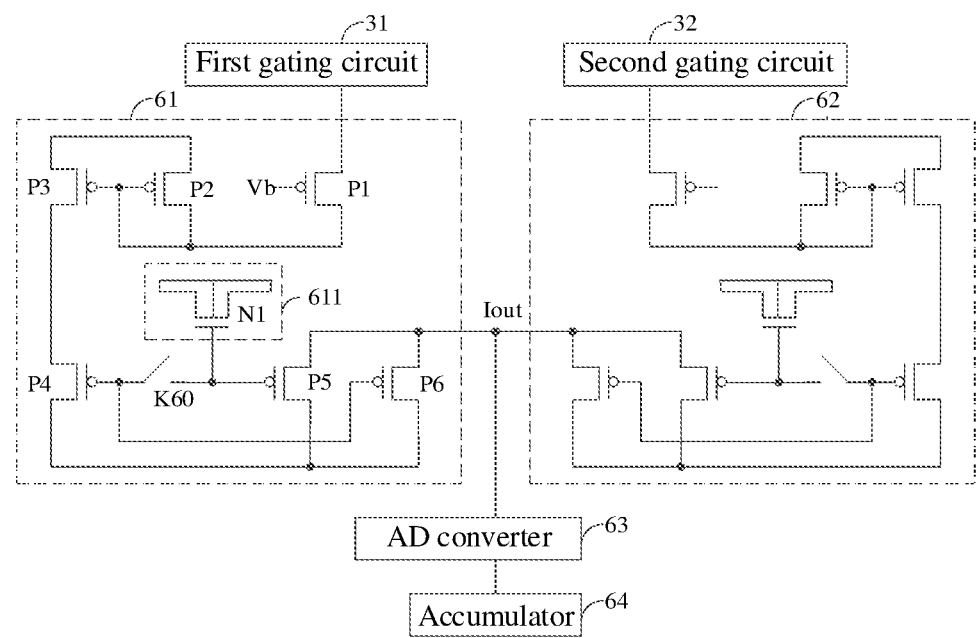
FIG. 6 is a schematic diagram of a circuit structure of a readout circuit in a computing-in-memory circuit according to some embodiments of the present disclosure.

FIG. 6 is a circuit diagram of a readout circuit of a computing-in-memory circuit according to some embodiments of the present disclosure. In FIG. 6, the readout circuit 35 may include a first amplifier circuit 61, a second amplifier circuit 62, a current node Iout, an analog-to-digital (AD) converter 63, and an accumulator 64.

The first amplifier circuit 61 is configured to amplify a current on a first bit line that a selected memory cell connects so as to obtain a first amplified current. For example, the selected memory cell is a certain memory cell of the first column, the first amplifier circuit 61 is configured to amplify the current on the first bit line LBL0.

The second amplifier circuit 62 is configured to amplify a current on a second bit line that the selected memory cell connects so as to obtain a second amplified current. An amplification factor of the second amplifier circuit is different from that of the first amplifier circuit. For example, the selected memory cell is a certain memory cell of the first column, the second amplifier circuit 62 is configured to amplify the current on the second bit line MBL0.

The current node Iout is configured to receive the first amplified current and the second amplified current and then superimpose the first amplified current and the second amplified current to obtain the current of the selected memory cell.

The AD converter 63 is configured to convert the current of the selected memory cell into a corresponding digital signal. The accumulator 64 is configured to accumulate a digital signal corresponding to the current of each memory cell located in the same column together, so an accumulated result is an outcome of the convolution operation.

In some embodiments, the first amplifier circuit 61 includes a first PMOS transistor P1, a second PMOS transistor P2, a third PMOS transistor P3, a fourth PMOS transistor P4, a fifth PMOS transistor P5, a sixth PMOS transistor P6, a toggle switch K60, and an energy storage unit 611.

The source of the first PMOS transistor P1 serves as a first input terminal of the first amplifier circuit 61, which is configured to connect the first gating circuit 31, the gate of the first PMOS transistor P1 receives a bias voltage Vb, and the drain of the first PMOS transistor P1 is connected to the gate of the second PMOS transistor P2, the source of the second PMOS transistor P2 and the source of the third PMOS transistor P3. The drain of the second PMOS transistor P2 is connected to the drain of the third PMOS transistor P3. The source of the third PMOS transistor P3 is connected to the drain of the fourth PMOS transistor P4. The gate of the fourth PMOS transistor P4 is connected to one end of the toggle switch K60 and the gate of the sixth PMOS transistor P6, and the source of the fourth PMOS transistor P4 is connected to the source of the fifth PMOS transistor P5 and the source of the sixth PMOS transistor P6. The gate of the fifth PMOS transistor P5 is connected to the other end of the toggle switch K60 and the energy storage unit 611, and the drain of the fifth PMOS transistor P5 and the drain of the sixth PMOS transistor P6 are connected to the current node. A control end of the toggle switch K60 receives a switching control signal. The switching control signal is turned on when the word line that the selected memory cell connects receives a low-order data, and is turned off when the word line that the selected memory cell connects receives a high-order data.

In some embodiments, a logic value of a high-order data unit of a selected memory cell is amplified by 3 times, i.e., a ratio of the aspect ratio of the third PMOS transistor P3 to the aspect ratio of the second PMOS transistor P2 is 3. A logic value of a low-order data unit of the selected memory cell is amplified by 1.5 times. Also, the high-order data received by the word line that the selected memory cell connects is decreased to one-half of its original value, and the low-order data received by the word line that the selected memory cell connects is decreased to one quarter of its original value. That is, a ratio of the aspect ratio of the fifth PMOS transistor P5 to the aspect ratio of the second PMOS transistor P2 is 0.25, and a ratio of the aspect ratio of the sixth PMOS transistor P6 to the aspect ratio of the second PMOS transistor P2 is 0.5. By decreasing the high-order data received by the word line that the selected memory cell connects to one-half of its original value and decreasing the low-order data received by the word line that the selected memory cell connects to one-quarter of its original value, low power consumption can be achieved.

In some embodiments, the energy storage unit 611 may be an NMOS transistor N1. The gate of the NMOS transistor N1 is connected to the other end of the toggle switch K60 and the gate of the fifth PMOS transistor P5, and the source of the NMOS transistor N1 is connected to the drain of the NMOS transistor N1 and the substrate of the NMOS of transistor N1. By using the NMOS transistor N1 for energy storage, the area of the integrated circuit can be reduced.

A circuit structure of the second amplifier circuit 62 is the same as that of the first amplifier circuit 61, which will not be described any further here.

The source line module 24 is configured to supply respective source line voltages to the N first source lines and the N second source lines in both the storage mode and the computation mode, respectively. In the storage mode, the source line module 24 supplies a voltage of 2V to 3V to a first source line that the selected memory cell connects, supplies a voltage of 2V to 3V to a second source line that the selected memory cell connects, and supplies a voltage of 0V to both first lines and second source lines that the unselected memory cells connect. In the computation mode, the source line module 24 supplies a voltage of 2V to 3V to the first source line that the selected memory cell connects, supplies a voltage of 2V to 3V to the second source line that the selected memory cell connects, and supplies a voltage of 0V to both the first lines and second source lines that the unselected memory cells connect.

The foregoing is only embodiments of the present disclosure, and is not intended to limit the protection scope of the present disclosure. Any modifications, equivalent replacements, and improvements made within the spirit and principles of the present disclosure shall be included within the scope of protection of the present disclosure.

What claimed is:

1. A computing-in-memory circuit, comprising a Resistive Random Access Memory (RRAM) array and a peripheral circuit, wherein
the RRAM array comprises a plurality of memory cells arranged in an array pattern, and each memory cell is configured to store a data of L bits, L being an integer not less than 2;
the peripheral circuit is configured to, in a storage mode, write more than one convolution kernels into the RRAM array, and in a computation mode, input elements that need to be convolved in a pixel matrix into the RRAM array and read a current of each column of memory cells, wherein each column of memory cells stores one convolution kernel correspondingly, and one element of the convolution kernel is stored in one memory cell correspondingly, and one element of the pixel matrix is correspondingly input into a word line that a row of memory cells connect.

2. The computing-in-memory circuit according to claim 1, wherein each memory cell is configured to store a data of two bits, and the RRAM array comprises M word lines, N first bit lines, N second bit lines, N first source lines, N second source lines, and memory cells of M rows and N columns, wherein M and N are positive integers;

wherein each memory cell comprises a first unit and a second unit, the first unit comprises a first switch and a first memristor, and the second unit comprises a second switch and a second memristor;

wherein a control end of the first switch serves as a first end of the memory cell, one end of the first switch serves as a second end of the memory cell, another end of the first switch is connected to one end of the first memristor, another end of the first memristor serves as a third end of the memory cell, a control end of the second switch serves as a fourth end of the memory cell, one end of the second switch serves as a fifth end of the memory cell, another end of the second switch is connected to one end of the second memristor, and another end of the second memristor serves as a sixth end of the memory cell;

wherein the first end and the fourth end of each of the memory cells located in a same row are connected to a same word line, the second end of each of the memory cells located in a same column is connected to a same first source line, the third end of each of the memory cells located in the same column is connected to a same first bit line, the fifth end of each of the memory cells located in the same column is connected to a same second source line, and the sixth end of each of the memory cells located in the same column is connected to a same second bit line.

3. The computing-in-memory circuit according to claim 2, wherein the peripheral circuit comprises a word line module, a bit line module and a source line module;

the word line module is configured to supply respective word line voltages to the M word lines in the storage mode, and input corresponding elements in the pixel matrix into the M word lines in the computation mode;

the bit line module is configured to supply respective bit line voltages to the N first bit lines and the N second bit lines in the storage mode, and read the current of each column of memory cells in the computation mode; and the source line module is configured to supply respective source line voltages to the N first source lines and the N second source lines in both the storage mode and the computation mode, respectively.

4. The computing-in-memory circuit according to claim 3, wherein each element in the pixel matrix is serial data of two bits.

5. The computing-in-memory circuit according to claim 3, wherein the bit line module comprises a first gating circuit, a second gating circuit, a first voltage supply circuit, a second voltage supply circuit, and a readout circuit;

the first gating circuit is configured to, in the storage mode, connect a first bit line that a selected memory cell connects with an output terminal of the first voltage supply circuit, and in the computation mode, connect the first bit line that the selected memory cell connects with a first input terminal of the readout circuit;

the second gating circuit is configured to, in the storage mode, connect a second bit line that the selected memory cell connects with an output terminal of the second voltage supply circuit, and in the computation mode, connect the second bit line that the selected memory cell connects with a second input terminal of the readout circuit;

the first voltage supply circuit is configured to supply a set voltage to the first bit line that the selected memory cell connects in the storage mode, and the second voltage supply circuit is configured to supply the set voltage to the second bit line that the selected memory cell connects in the storage mode; and the readout circuit is configured to read out a current of each memory cell located in a same column in the computation mode, and accumulate the current of each memory cell located in the same column together.

6. The computing-in-memory circuit according to claim 5, wherein the first gating circuit comprises a storage control switch, a computation control switch, and N column gating switches;

one end of the storage control switch is connected to the output terminal of the first voltage supply circuit, and another end of the storage control switch is connected to one end of the computation control switch and one end of each of the N column gating switches, and a control end of the storage control switch receives a first control signal;

another end of the computation control switch is connected to the first input terminal of the readout circuit, and a control end of the computation control switch receives a second control signal;

another end of each column gating switch is correspondingly connected to one first bit line, a control end of each column gating switch correspondingly receives one column gating signal.

7. The computing-in-memory circuit according to claim 5, wherein the first voltage supply circuit comprises a level shifter, an inverter and a CMOS transmission gate;

one input end of the level shifter is connected to an input end of the inverter, and an output end of the inverter is connected to another input end of the level shifter; one output end of the level shifter is connected to one control end of the CMOS transmission gate, and another output end of the level shifter is connected to another control end of the CMOS transmission gate; an input end of the CMOS transmission gate is configured to receive an operating voltage, and an output end of the CMOS transmission gate serves as an output terminal of the first voltage supply circuit.

8. The computing-in-memory circuit according to claim 5, wherein the readout circuit comprises a first amplifier circuit, a second amplifier circuit, a current node, an AD converter, and an accumulator;

the first amplifier circuit is configured to amplify a current on a first bit line that a selected memory cell connects to obtain a first amplified current;

the second amplifier circuit is configured to amplify a current on a second bit line that the selected memory cell connects to obtain a second amplified current, wherein an amplification factor of the second amplifier circuit is different from an amplification factor of the first amplifier circuit;

the current node is configured to receive the first amplified current and the second amplified current to obtain a current of the selected memory cell;

the AD converter is configured to convert the current of the selected memory cell into a corresponding digital signal; and the accumulator is configured to accumulate the digital signal corresponding to the current of each memory cell located in the same column together.

9. The computing-in-memory circuit according to claim 8, wherein the first amplifier circuit comprises a first PMOS transistor, a second PMOS transistor, a third PMOS transistor, a fourth PMOS transistor, a fifth PMOS transistor, a sixth PMOS transistor, a toggle switch, and an energy storage unit;

a source of the first PMOS transistor serves as a first input terminal of the first amplifier circuit, and a gate of the first PMOS transistor receives a bias voltage, and a drain of the first PMOS transistor is connected to a gate of the second PMOS transistor, a source of the second PMOS transistor and a source of the third PMOS transistor;

a drain of the second PMOS transistor is connected to a drain of the third PMOS transistor;

the source of the third PMOS transistor is connected to a drain of the fourth PMOS transistor;

a gate of the fourth PMOS transistor is connected to one end of the toggle switch and a gate of the sixth PMOS transistor, and a source of the fourth PMOS transistor is connected to a source of the fifth PMOS transistor and a source of the sixth PMOS transistor;

a gate of the fifth PMOS transistor is connected to another end of the toggle switch and the energy storage unit, and a drain of the fifth PMOS transistor and a drain of the sixth PMOS transistor are connected to the current node; and a control end of the toggle switch receives a switching control signal.

10. The computing-in-memory circuit according to claim 9, wherein the energy storage unit is an NMOS transistor;

a gate of the NMOS transistor is connected to another end of the toggle switch and the gate of the fifth PMOS transistor, and a source of the NMOS transistor is connected to a drain of the NMOS transistor and a substrate of the NMOS transistor.

\* \* \* \* \*